(12) United States Patent
Sullivan et al.

(10) Patent No.: US 6,313,568 B1
(45) Date of Patent: Nov. 6, 2001

(54) PIEZOELECTRIC ACTUATOR AND VALVE ASSEMBLY WITH THERMAL EXPANSION COMPENSATION

(75) Inventors: Jeffrey J. Sullivan, Columbus; John D. Crofts, Edinburg, both of IN (US)

(73) Assignee: Cummins Inc., Columbus, IN (US)

( * ) Notice: Subject to any disclaimer, the term of this patent is extended or adjusted under 35 U.S.C. 154(b) by 0 days.

(21) Appl. No.: 09/452,385

(22) Filed: Dec. 1, 1999

(51) Int. Cl.$^7$ .................................................. H01L 41/04
(52) U.S. Cl. .............................................................. 310/346
(58) Field of Search ........................... 310/346; 123/498; 239/88

(56) References Cited

U.S. PATENT DOCUMENTS

| | | | |
|---|---|---|---|
| 4,284,263 | 8/1981 | Newcomb | 251/129 |
| 4,463,727 | * 8/1984 | Babitzka et al. | 123/458 |
| 4,825,117 | 4/1989 | Thomas, III et al. | 310/346 |
| 5,094,429 | * 3/1992 | Shirai et al. | 251/129.06 |
| 5,150,049 | * 9/1992 | Schuetz | 324/207.12 |
| 5,205,147 | 4/1993 | Wada et al. | 72/429 |
| 5,376,860 | 12/1994 | Sato | 310/346 |
| 5,571,363 | 11/1996 | Brosig et al. | 156/292 |
| 5,626,116 | 5/1997 | Reedy et al. | 123/321 |
| 5,680,841 | 10/1997 | Hu | 123/322 |
| 5,740,969 | 4/1998 | Hoffmann et al. | 239/533.2 |
| 5,819,710 | 10/1998 | Huber | 123/498 |
| 5,875,764 | 3/1999 | Kappel et al. | 123/467 |
| 6,085,990 | * 7/2000 | Augustin | 239/88 |

FOREIGN PATENT DOCUMENTS

| | | |
|---|---|---|
| 0 869 278 | * 10/1998 | (EP) . |
| 61-258485 | 11/1986 | (JP) . |
| 62-36884 | 2/1987 | (JP) . |
| 02-293637 | * 12/1990 | (JP) . |
| 10-009084 | * 1/1998 | (JP) . |
| WO 93/25803 | 12/1993 | (WO) . |

* cited by examiner

Primary Examiner—Nestor Ramirez
Assistant Examiner—Peter Medley
(74) Attorney, Agent, or Firm—Nixon Peabody LLP; Charles M. Leedom, Jr.; James E. Howard

(57) ABSTRACT

A piezoelectric actuator assembly that is insensitive to wide variations in operating temperatures including a stack of piezoelectric devices and a surrounding housing assembly formed of an outer cylindrical housing portion formed of steel having a coefficient of thermal expansion above that of the piezoelectric material and an inner cylindrical housing portion formed of Si—Ni ceramic. By arranging the inner and outer housing portions in parallel and forming the housing portions with appropriate cross-sectional areas, the housing assembly will have an effective coefficient of thermal expansion $\alpha_e$ that is equivalent to that of the piezoelectric element $\alpha_p$. In particular, if the material of the first housing portion has a modulus $E_{m1}$ and an effective cross-sectional area $A_{m1}$, and the material of the second housing portion has a modulus $E_{m2}$ and an effective cross-sectional area $A_{m2}$, the resultant effective coefficient of thermal expansion will be given by the following formula:

$$\alpha_p = \frac{\alpha_{m1} + \alpha_{m2}\frac{E_{m2}}{E_{m1}}\left(\frac{A_{m2}}{A_{m1}}\right)}{\left(1 + \frac{E_{m2}}{E_{m1}}\left(\frac{A_{m2}}{A_{m1}}\right)\right)}$$

17 Claims, 4 Drawing Sheets

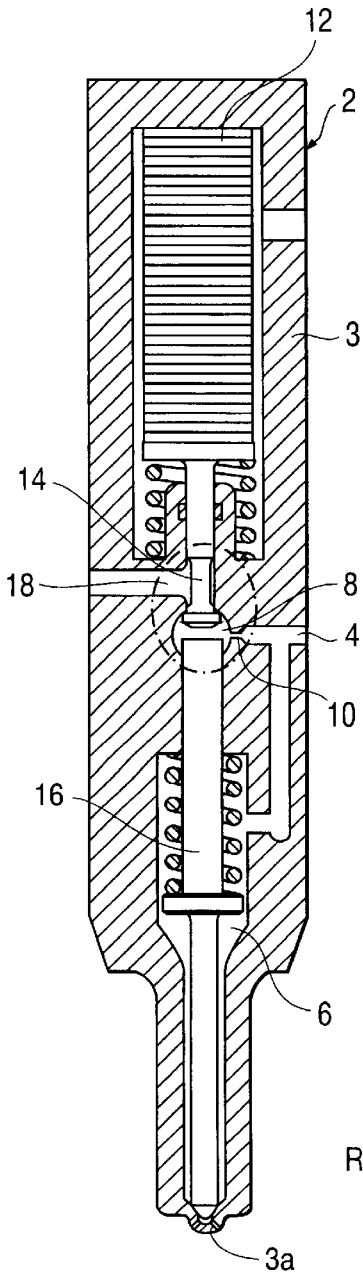
FIG. 1
(PRIOR ART)
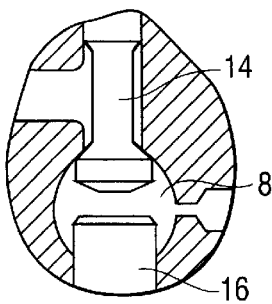
1. VALVE 14 CLOSED
NEEDLE 16 CLOSED
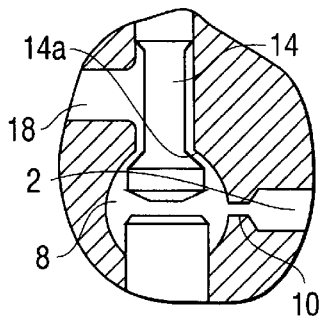
2. VALVE OPEN
NEEDLE STARTING
TO OPEN
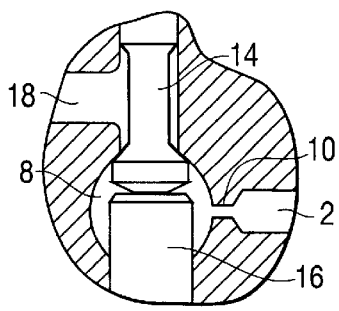
3. NEEDLE FULLY OPEN
VALVE PARTIALLY CLOSED
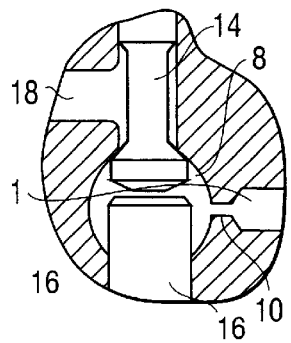
4. VALVE CLOSED
NEEDLE STARTING
TO CLOSE
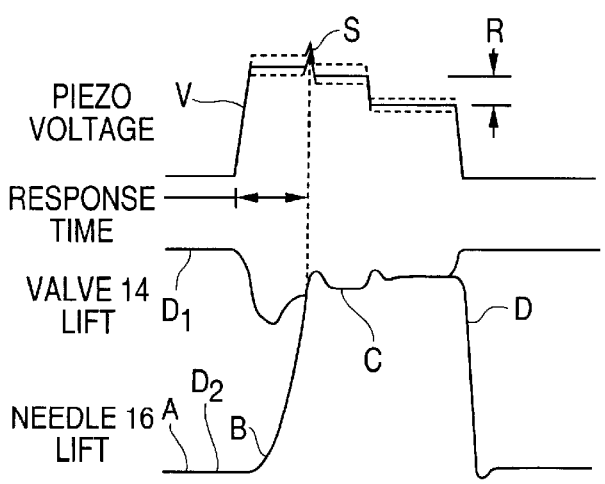

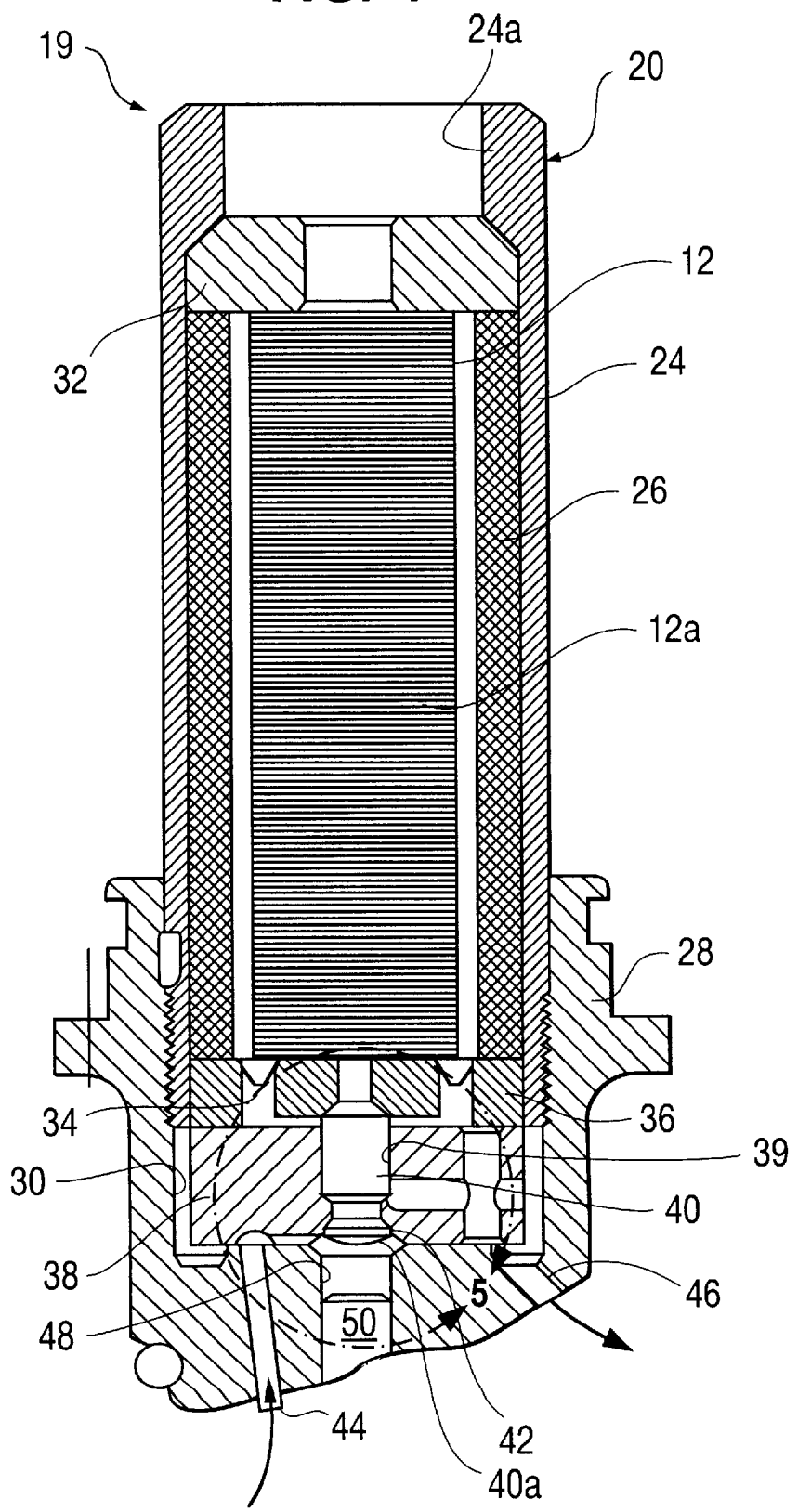

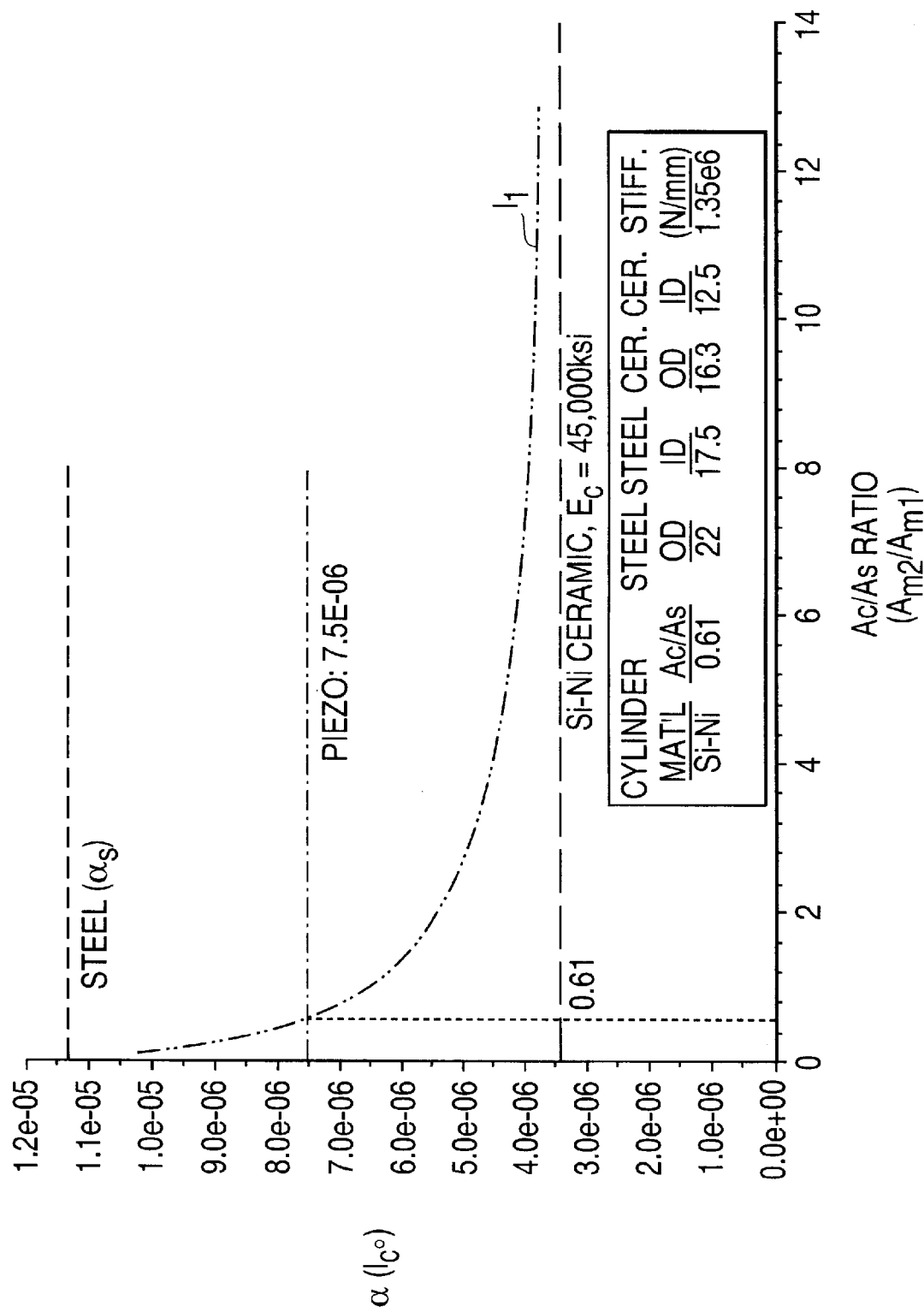

PIEZOELECTRIC ACTUATOR AND VALVE ASSEMBLY WITH THERMAL EXPANSION COMPENSATION

Related Application: U.S. application Ser. No. 09/371,273 filed Aug. 10, 1999 entitled Fuel Injector Nozzle Assembly With Feedback Control.

FIELD OF THE INVENTION

The subject invention relates to the field of piezoelectric actuators and valve assemblies using such actuators such as employed in high pressure fuel injection systems where accurate predictable operating characteristics over a broad temperature range are critical.

BACKGROUND OF THE INVENTION

Piezoelectric actuators have long been recognized as highly desirable for use in systems requiring extremely fast mechanical operation in response to an electrical control signal. For this reason piezoelectric actuators are now receiving considerable attention by designers of fuel supply systems for internal combustion engines. Such designers are continually searching for ways to obtain faster, more precise, reliable and predicable control over the timing and quantity of successive fuel injections into the combustion chambers of internal combustion engines to help meet the economically and governmentally mandated demands for increasing fuel economy and reduced air pollution. If such goals are to be attained, fuel control valves must be designed to provide extremely fast and reliable response times.

When used as a valve actuator, piezoelectric devices are known to provide extremely fast, reliable characteristics when calibrated to and operated at a relatively constant temperature. However, internal combustion engines are required to operate reliably over an extremely broad ambient temperature range. Moreover, fuel injection valves mounted directly on the engine are subjected to an even broader range of temperatures since the operating temperatures of an internal combustion engine may extend well above ambient temperatures and may reach as much as 140° C. or more. Such temperature extremes can produce wide variations in the operating characteristics (e.g. length of stroke and/or reaction time) of a piezoelectric actuator. Such actuator variations can lead to wide variations in timing and quantity when the piezoelectric actuator is used to control fuel injection into an internal combustion engine.

Numerous attempts have been made to overcome the problem of thermally induced variations in piezoelectric actuator operation. For example, U.S. Pat. No. 4,284,263 to Newcomb (assigned at issuance to U.S. Philips Corporation) discloses a control valve including a piezoelectric actuator which is temperature compensated by the provision of material having a high coefficient of thermal expansion in series with the piezoelectric material to match the coefficient of thermal expansion of the surrounding actuator housing. While this approach reduces temperature induced variation in operating characteristics, the length of the actuator assembly is by necessity substantially increased as compared with actuators which are not temperature compensated in this manner.

Another approach is disclosed in U.S. Pat. Nos. 5,740,969 and 5,819,710 (assigned at issuance to Mercedes-Benz) wherein two different materials having coefficients of thermal expansion both above and below that of piezoelectric material are placed in series to form the actuator housing having an effective coefficient of thermal expansion approximating that of the piezoelectric material. While the size of this assembly is not necessarily greater than an uncompensated piezoelectric actuator, the complexity and strength of the actuator may be compromised. For example, the housing illustrated in the '696 patent includes an upper housing portion 5a formed of Invar having a low coefficient of thermal expansion and a lower housing portion 5b formed of steel having a high coefficient of thermal expansion. This arrangement requires the housing portions to be joined end to end and thus adds to the cost of the resulting assembly and provides a possible point of weakness or failure. Other piezoelectric actuators have been disclosed with similar types of temperature compensation such as illustrated in U.S. Pat. No. 5,205,147 to Wada et al.

A still more complicated approach is disclosed in U.S. Pat. No. 5,875,764 to Kapel et al. (assigned at issuance to Siemens Aktiengesellschaft) including a hydraulic system for compensating for thermal growth in a piezoelectric actuator for a valve. While suitable for the purposes disclosed, this reference fails to disclose a simple mechanical system for automatically compensating for temperature changes and fails to suggest a method for easily overcoming the defects of the prior art.

Other techniques for temperature compensating piezoelectric devices are disclosed in the following references U.S. Pat. No. 5,571,363

U.S. Pat. No. 5,376,860

U.S. Pat. No. 4,825,117

Japanese Patent No. 61-258485

Japanese Patent No. 62-36884

None of the references noted above discloses a technique for providing a simplified method for temperature compensating a piezoelectric actuator in a manner to overcome the short comings of the prior art.

SUMMARY OF THE INVENTION

A primary object of this invention is to provide a temperature compensated piezoelectric actuator to overcome the deficiencies of the prior art and, in particular, to provide a piezoelectric actuator which compensates for temperature variations and simultaneously increases the ruggedness and stiffness of the actuator.

Another more specific object of this invention is to provide a temperature compensated piezoelectric actuator including an actuator housing having first and second housing portions shaped and affixed generally in parallel relationship to cause the displacement and the response time of the actuator to be the same at any given temperature within the predetermined temperature range upon application of the same electrical potential to said piezoelectric element.

Still another object of the subject invention is to provide a piezoelectric actuator including an actuator housing having first and second housing portions positioned in generally parallel relationship to one another in a manner to have an effective coefficient of thermal expansion $\alpha_e$ equal to the coefficient of thermal expansion of said piezoelectric element over the predetermined range of operating temperatures.

A still more specific object of the invention is to provide a piezoelectric actuator including an actuator housing including a first housing portion positioned along the extendable length of the piezoelectric material which has a coefficient of thermal expansion $\alpha_p$, The first housing portion is formed of a first material having a coefficient of thermal expansion $\alpha_{m1} > \alpha_p$ and a second housing portion mounted in parallel relationship to the first housing portion. The second housing portion is formed of a second material having a coefficient of thermal expansion $\alpha_{m2}<\alpha_p$. The first and second housing portions are shaped and affixed to one another in a manner to have an effective coefficient of thermal expansion $\alpha_e$ equal to the coefficient of thermal expansion of the piezoelectric element over the predetermined range of operating temperatures to cause the displacement of and the response time of the actuator to be the same at any given temperature within the predetermined temperature range upon application of the same electrical potential to the piezoelectric element.

Still another more specific object of this invention is to provide a piezoelectric actuator assembly as described in one or more of the above objects and advantages, wherein the first material has a modulus $E_{m1}$ and the first housing portion has an effective cross-sectional area $A_{m1}$, and wherein the second material has a modulus $E_{m2}$ and the second housing portion has an effective cross-sectional area $A_{m2}$ and further wherein the ratio of $A_{m2}/A_{m1}$ is selected such that $$\alpha = \frac{a_{m1} + a_{m2}\frac{E_{m2}}{E_{m1}}\left(\frac{A_{m2}}{A_{m1}}\right)}{\left(1 + \frac{E_{m2}}{E_{m1}}\left(\frac{A_{m2}}{A_{m1}}\right)\right)}$$

Another object of the subject invention is to provide an piezoelectric actuator as described in one or more of the above objects and advantages wherein the first housing portion is cylindrical and the second housing portion is cylindrical and located concentrically within said first portion and wherein the first material is steel and said second material is ceramic material such as Si—Ni ceramic. Use of ceramic materials has a secondary advantage in that it provides added strength and rigidity to the actuator housing and assembly.

Still another object of the subject invention is to provide a piezoelectric actuator as described in one or more of the above objects and advantages wherein the cylindrical first portion is formed of steel and the cylindrical second portion is formed of a piezoelectric material to which an actuating voltage may be applied at the same time as the piezoelectric actuator element.

Yet another object of the subject invention is to provide an actuator as described in one or more of the above objects and advantages including a piezoelectric element formed as a laminated stack of piezoelectric devices, wherein the cylindrical first housing portion includes a shoulder extending radially inwardly at one end and wherein the housing includes a disc located within the first housing portion engaging the shoulder on one side and engaging the piezoelectric element on the other side to define the fixed position for the supported end of the piezoelectric element, and further wherein the disc being positioned within the cylindrical first housing portion to engage one end of the cylindrical second housing portion and further including a spacer located within the cylindrical first housing portion in stacked co-axial relationship with the other end of the cylindrical second housing portion, wherein the housing is adapted to be mounted in a manner to place the cylindrical first housing portion in tension while placing the cylindrical second housing portion and the spacer in compression.

The above objects can be achieved in a piezoelectric actuator for a valve such as a fuel injection control valve for an internal combustion engine wherein the constant flow characteristics of the valve and the vary rapid constant response time achievable through use of the subject invention over the entire range of operating temperatures of the internal combustion engine (e.g. −40° to 140° C.) would have particular utility in affording extremely fast and predictable control over fuel injection into each combustion chamber of the engine. In particular, the various objects of the invention can be achieved in a fuel injection control valve assembly having a constant operating stroke and response time throughout a predetermined range of operating temperatures, comprising a valve body including an inlet, an outlet, a valve seat located within a fluid pathway between the inlet and the outlet; a valve element mounted to move between (i) a closed position engaging the valve seat to shut off the fluid within the pathway, and (ii) an open position spaced from the valve seat to permit fluid communication between the inlet and the outlet. More particularly, the desirable operating characteristics are achieved in the fuel injector control valve by providing a piezoelectric valve actuator for moving the valve element between the opened and closed positions upon application of electrical potential. The piezoelectric valve actuator includes a piezoelectric element adapted to change its length upon application of an electrical potential, the piezoelectric element having a coefficient of thermal expansion $\alpha_p$, and an actuator housing at least partially surrounding the piezoelectric element, one end of said piezoelectric element being supported in fixed position relative to said actuator housing. The actuator housing includes a first housing portion, formed of a first material having a coefficient of thermal expansion $\alpha_{m1}>\alpha_p$ and a second portion mounted in parallel relationship to the first housing portion. The second housing portion is formed of a second material having a coefficient of thermal expansion $\alpha_{m2}<\alpha_p$. An important feature of the invention is that the first and second housing portions should be shaped and affixed to one another in a generally parallel manner to have an effective coefficient of thermal expansion $\alpha_e$ equal to the coefficient of thermal expansion of said piezoelectric element over the predetermined range of operating temperatures to cause the displacement and the response time of the fuel injector control valve to be the same at any given temperature within the predetermined temperature range upon application of the same electrical potential to the piezoelectric element.

Still other and more specific objects, features and advantages of the invention may be appreciated from the following Brief Summary of the Drawings and Detailed Description of the Invention.

BRIEF SUMMARY OF THE DRAWINGS

FIG. 1 is a schematic, vertical cross-sectional view of a fuel injector control valve of the type that would benefit particularly from utilization of a piezoelectric actuator designed in accordance with the subject invention.

FIGS. 2a through 2d disclose various views of the valve element controlled by the piezoelectric device of the fuel injector control valve of FIG. 1.

FIG. 3 is a graph disclosing the voltage across the piezoelectric device of FIG. 1 and the corresponding displacement (lift) of the valve element directly actuated by the piezoelectric device and the corresponding displacement of a needle valve.

FIG. 4 is a vertical cross-sectional view of a piezoelectric electric actuator for a fuel injector valve designed in accordance with the subject invention.

FIG. 7 is a graph illustrating the relationship of the coefficients of thermal expansion and the resultant ratio of the cross sectional areas of the respective cylindrical portions forming the actuator housing of FIG. 4.

DETAILED DESCRIPTION OF THE INVENTION

Figure 5:
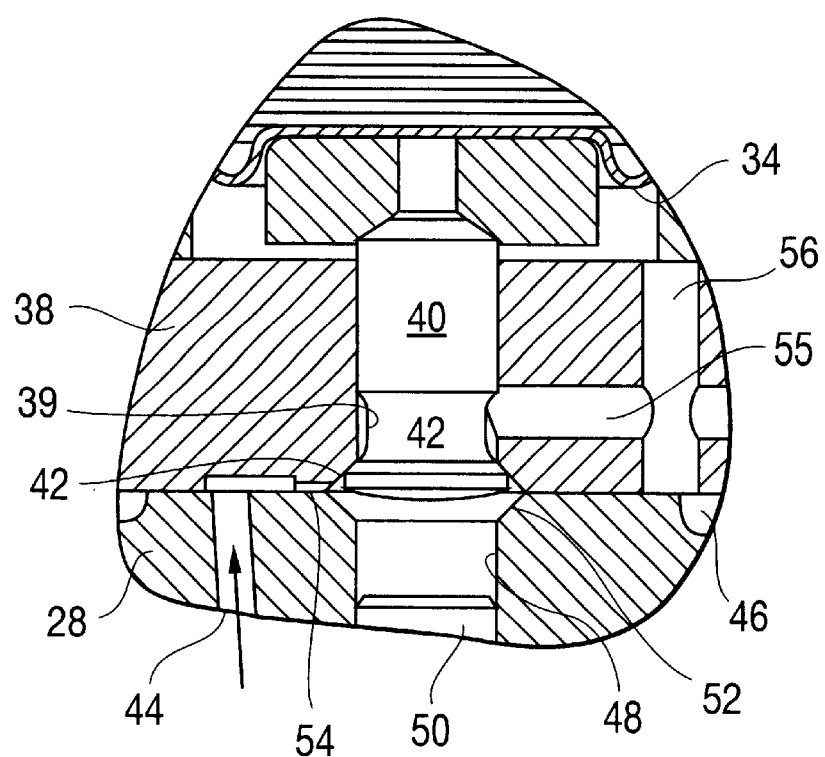
FIG. 5 is a broken away enlarged view of the valve element area of the actuator of FIG. 4 taken along lines 5—5.

The subject invention is directed to a piezoelectric actuator which is insensitive to changes in temperature over a predetermined range of operating temperatures that has particular utility in improving the accuracy and reliability of a fuel injector control valve for use in an internal combustion engine, such as a diesel engine requiring extremely accurate control over the injection of fuel at very high pressures, e.g. 500 to 2000 bar. A particularly important characteristic of the piezoelectric actuator housing is that it includes first and second portions formed of materials having coefficients of thermal expansion that are respectively greater than and less than the coefficient of thermal expansion of the piezoelectric element. The actuator housing portions are shaped and affixed to one another in parallel in a manner to have an effective coefficient of thermal expansion equal to the coefficient of thermal expansion of the piezoelectric element over the entire range of operating temperatures of the fuel injection control valve to cause the valve response time to be not only extremely fast but also predictable and reliable over the entire operating temperature range of the valve.

To understand the environment in which this invention has particular utility, reference is made to FIG. 1 which shows one type of fuel injector nozzle assembly 2 wherein the subject invention would be particularly useful. Assembly 2 includes a assembly body 3 containing the flow paths and valve elements necessary to allow for very precise control over fuel injection into the combustion cylinder (not illustrated) of an internal combustion engine from an injection orifice 3a contained at one end of the assembly body.

High pressure fuel (in the range of 150 to 2000 Bar) is supplied to the inlet 4 from an external source (not shown). Inside the injector the high pressure fuel is available to the nozzle chamber 6 and to the control chamber 8 via control chamber inlet orifice 10. A piezoelectric element 12 is provided in the upper portion of the nozzle assembly. The piezoelectric element 12 is formed by a stack of piezoelectric devices 12a to accentuate the effect of applying an actuating voltage across each device by means of electrical conductors (not illustrated). While the piezoelectric element 12 is de-energized, control valve 14 is closed and pressure in control chamber 8 is equal to the fuel pressure in inlet 4. This results in needle 16 being held in the closed position, as shown in FIG. 1.

FIG. 2a is an enlargement showing the position of the control valve element 14 in its fully closed position when the piezoelectric element is de-energized. Needle 16 is held in its fully closed position shown in FIG. 1 by the supply pressure in control chamber 8. FIG. 2b illustrates the position of control valve element 14 when the piezoelectric element 12 is energized by an electric potential causing control valve 14 to be pushed downwardly. With control valve element 14 in the extreme open position, pressure in control chamber 8 drops because control valve element 14 has moved sufficiently far away from its seat 14a to form a passageway to drain 18 that exceeds the flow capacity of orifice 10 and allows needle 14 to lift.

FIG. 2c shows needle 16 fully open and in contact with control valve element 14. The impact of needle 16 with control valve element 14 can be detected by an electronic control module (not shown).

Once needle 16 starts to open, control valve element 14 can be partially closed. The lifting force from needle 16 will tend to partially close control valve element 14 and the applied piezoelectric voltage can also be reduced. Partially closing control valve element 14 during injection reduces the quantity of high pressure fuel that is lost to injector drain flow 18. FIG. 2d shows control valve element 14 closed and needle 16 starting to close. When control valve element 14 is closed, pressure in control chamber 8 increases and causes needle 16 to close which ends injection.

FIG. 3 is a graph illustrating the voltage applied to the piezoelectric element 12 (line V), the lift of control valve element 14 (line $D_1$) and the lift of the needle 16 (line $D_2$) over the time interval encompassing a fuel injection event. The points labeled a–d on the line $D_2$ correspond to the positions of the needle valve illustrated in FIGS. 2a–2d, respectively. When the needle 16 first contacts valve element 14, a spike appears in the voltage across the piezoelectric element as illustrated at S on line V. It is useful to know when this contact takes place which can be determined by monitoring the piezoelectric voltage signal illustrated by line V. Other methods of detecting when the needle 16 impacts the control valve 14 may be employed. As an example of the usefulness of detecting the time of contact, it is possible to determine if the opening time of needle 16 falls within predetermined limits. If not, the voltage waveform applied to the piezoelectric element 12 can be adjusted by an electronic control module. For example, if the detected response time is less than a predetermined target, the piezoelectric voltage could be reduced for the next injection. As noted above, closing of control valve 14 can be assisted by contact with needle 16. The closing can be further assisted by reducing the voltage applied to the piezoelectric element 12. Such a reduction can be in an amount R as illustrated in FIG. 3.

FIG. 4 is an enlarged cross-sectional view of the upper portion of a fuel injector nozzle assembly 19, generally of the type illustrated in FIGS. 1 and 2a–2d, which has been modified to include a piezoelectric actuator assembly 20 designed in accordance with the subject invention. As will be described more fully below, the piezoelectric actuator assembly 20 includes a housing assembly having an effective coefficient of thermal expansion that matches that of the piezoelectric element 12 which renders the overall actuator assembly and the fuel injector nozzle operation insensitive to wide changes in operating temperature. More particularly, the piezoelectric actuator assembly 20 includes a piezoelectric element 12 formed of a sufficient number of piezoelectric devices 12a stacked together to provide an actuator stroke, when the element is energized, that is sufficient in length to achieve the flow characteristics required in a particular application. Surrounding the piezoelectric element 12 is a housing 22 including an outer cylindrical housing portion 24 and an inner cylindrical housing portion 26 received coaxially within cylindrical housing portion 24. The nozzle assembly 19 includes a nozzle body 28 only the upper portion of which is illustrated in FIG. 4. A recess 30 contained in nozzle body 28 is provided with internal threads for receiving the threaded lower end of outer cylindrical housing portion 24. The upper end of outer cylindrical housing portion 24 includes a radially inwardly directed shoulder 24a. Received in stacked relationship within the interior of outer cylindrical housing portion 24 is an end disc 32 that abuts shoulder 24a on one side and engages the upper end of inner cylindrical housing portion 26 on the opposite side.

At the opposite end of the inner cylindrical housing portion 26 (stacked in series therewith) is a spring disc 34. The spring disc 34 functions to place upward bias on the lower end of the piezoelectric element 12 to cause the opposite end thereof to engage the lower surface of end disc 32. Below spring disc 34 is a spacer 36 and thereafter a valve plate 38 both of which are placed under compression as the outer cylindrical housing portion is rotated to the desired degree to create an appropriate compression of the end disc 32, inner cylindrical housing portion 26, spring disc 34, and valve plate 38. Simultaneously, the outer cylindrical housing portion 24 is placed under tension. For the reasons described below, this arrangement of elements allows the effective coefficient of thermal expansion of the housing assembly to be controlled to match that of the piezoelectric element 12 by appropriate selection of the materials of which the inner and outer cylindrical housing portions 24 and 26 are made and by forming the housing portions such that their respective cross-sectional areas have a predetermined ratio. To achieve the desired result, the cross-sectional areas must be a predetermined function of the coefficients of thermal expansion and the elastic moduli of the materials of which cylindrical housing portions 24 and 26 are formed.

The piezoelectric element 12 is arranged to advance the control valve element 40 (corresponding to control valve element 14 of FIG. 1) positioned for reciprocal movement in a central bore 39 of the valve plate 38. The lower end of control valve element 40 includes a radially extending portion 40a arranged to engage and seal a valve seat 42 formed at the lower end of the central bore 39. Valve seat 42 is located in a passageway connecting the valve inlet 44 to the valve outlet 46. Valve inlet 44 is supplied with fuel from a high pressure fuel supply- not illustrated and the valve outlet 46 is connected to a fuel drain- also not illustrated. Central bore 39 of the valve plate 38 is aligned with and communicates with a plunger bore 48 formed in the nozzle body 28. Plunger bore 48 receives the plunger 50 at the upper end of a needle valve (not illustrated) corresponding to the needle 16 of FIG. 1. The needle plunger 50 and the control valve element 40 operate in the same manner as the control valve element 14 and needle 16 of FIGS. 1 and 2a–2d.

As better illustrated in the enlarged cutaway view of FIG. 5, the radially extending portion 42 of control valve element 40 is received in a control chamber 52 formed by enlarged portions at the lower end of central bore 39 and at the upper end of plunger bore 52, respectively. High pressure fuel is received in control chamber 52 from valve inlet 44 through a cross passage 54 which forms a restricted orifice corresponding in function to inlet orifice 10 of FIG. 1. Fuel is allowed to flow out of control chamber 52 only when the piezoelectric element 12 is subjected to an energizing electrical potential applied through electrical conductors (not illustrated). Such outflow of fuel reaches the valve outlet 46 through a radial passage 55 and axial passage 56 formed in the valve plate 38.

Figure 6:
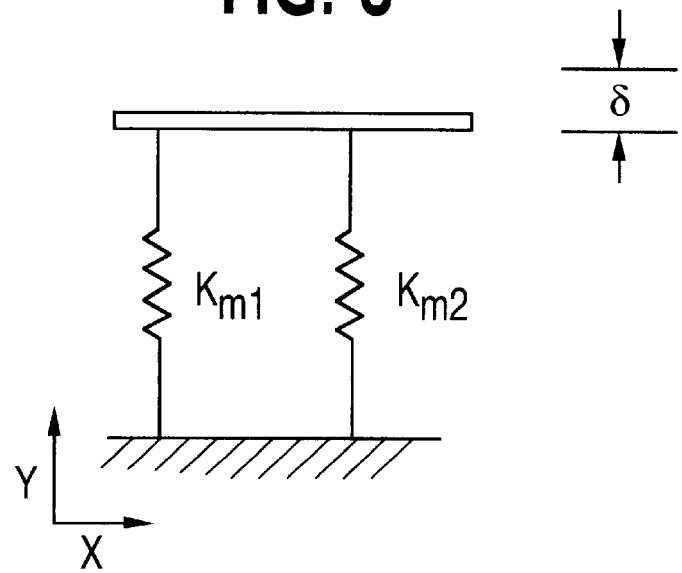
FIG. 6 is a schematic diagram illustrating the linear spring characteristics of the actuator housing of FIG. 4 formed of two concentric cylindrical portions formed of materials having differing coefficients of thermal expansion.

For the control valve element 40 and needle of FIG. 4 to have a highly reliable and predictable fuel injection control characteristic, the response time and stroke of the control valve element 40 must be constant over the full range of operating temperatures to which the fuel injector nozzle assembly 19 is subjected when in service. A typical temperature range would be −40° to 140° C. To achieve this result, the actuator housing must have an effective coefficient of thermal expansion $\alpha_e$ that is the same as the coefficient of thermal expansion $\alpha_p$ of the piezoelectric element 12. This result can be effected by forming the outer cylindrical housing portion 24 out of a material having a coefficient of thermal expansion $\alpha_{m1}$ above the coefficient of thermal expansion $\alpha_p$ of the piezoelectric element 12. At the same time the material forming the inner cylindrical housing portion 26 should have a coefficient of thermal expansion $\alpha_{m2}$ below that of the piezoelectric element. When the materials forming the inner and outer housing portions are selected in the this manner the desired coefficient of thermal expansion can be achieve by forming the housing portions with effective cross sectional areas $\alpha_{m1}$ and $\alpha_{m2}$, respectively, that conforms to the following equation:

$$\alpha = \frac{\alpha_{m1} + \alpha_{m2}\frac{E_{m2}}{E_{m1}}\left(\frac{A_{m2}}{A_{m1}}\right)}{\left(1 + \frac{E_{m2}}{E_{m1}}\left(\frac{A_{m2}}{A_{m1}}\right)\right)}$$

where $E_{m1}$ and $E_{m2}$ are the moduli of elasticity for materials that form the outer and inner cylindrical housing portions 24 and 26, respectively. To understand the derivation of the above equation, consider the diagram of FIG. 6 wherein the inner and outer housing portions are represented by idealized linear springs having spring constants $K_1$ and $K_2$ and wherein the springs have undergone a displacement $\delta$. This system will have an effective coefficient of thermal expansion $\alpha_e$ that can be determined as follows:

$A_{m1}$=cross sectional area of outer housing portion $A_{m2}$=cross sectional area of inner housing portion L=common length of respective housing portions in parallel $\delta$=change of length $E_{m1}$=elastic modulus of material forming the outer housing portion $E_{m2}$=elastic modulus of material forming the inner housing portion $\alpha_{m1}$ coefficient of thermal expansion of material forming the outer housing portion $\alpha_{m2}$ coefficient of thermal expansion of material forming the inner housing portion From Hook's law the force developed by a change in the length of a spring x is given by F=Kx Therefore, if the actual change in length is $-\delta$ than the force $F_{y1}$ generated in the outer housing portion will be $F_{y1}=-\delta K_1$ and similarly for the inner housing portion $F_{y2}=-\delta K_2$ The change of length $\delta$ due to a change in temperature $\Delta T$ is given by $\delta_t=\alpha \Delta TL$ where $\alpha$=coefficient of thermal expansion. Also, for a given material strain $\epsilon$:

$$\epsilon_{m1} = \alpha_{m1}\Delta T = \frac{\delta}{L}$$

Moreover, the force induced by a thermal change $\Delta T$ is given by:

$$F_{t1} = K_{m1}\delta_{m1}$$

$$= K_{m1}(\alpha\Delta T)L$$

therefore $F_{t1} = K_{m1}\alpha_{m1}\Delta TL$ but $KL = AE$ where A=effective cross sectional area, and E=elastic modulus $$\therefore F_{t1} = \alpha_{m1}\Delta T \cdot A_{m1}E_{m1}$$

and for the second housing $$F_{t2} = \alpha_{m2}\Delta T \cdot A_{m2}E_{m2}$$

From the laws of mechanics, the resultant of all forces on a static body is zero along any axis. Therefore the sum of all forces along the y axis $\Sigma F_y$ must be zero.

$$\therefore 0 = -\delta K_{m1} - \delta K_{m2} + \alpha_{m1}\Delta TA_{m1}E_{m1} + \alpha_{m2}\Delta TA_{m2}E_{m2}$$

$$\delta(K_{m1} + K_{m2}) = \alpha_{m1}\Delta TA_{m1}E_{m1} + \alpha_{m2}\Delta TA_{m2}E_{m2}$$

but since $$K = \frac{AE}{L}$$

$$\delta\left(\frac{A_{m1}E_{m1}}{L} + \frac{A_{m2}E_{m2}}{L}\right) = \Delta T(\alpha_{m1}E_{m1}A_{m1} + \alpha_{m2}A_{m2}E_{m2})$$

$$\frac{\delta}{L}(A_{m1}E_{m1} + A_{m2}E_{m2}) = \Delta T(\alpha_{m1}E_{m1}A_{m1} + \alpha_{m2}A_{m2}E_{m2})$$

$$\frac{\delta}{L} = \Delta T\left(\frac{\alpha_{m1}E_{m1}A_{m1} + \alpha_{m2}A_{m2}E_{m2}}{A_{m1}E_{m1} + A_{m2}E_{m2}}\right)$$

but $$\alpha^*\Delta T = \frac{\delta}{L}$$

where $\alpha^*$=effective coefficient of thermal expansion or $$\alpha^* = \frac{\alpha_{m1} + \alpha_{m2}\frac{E_{m2}}{E_{m1}}\left(\frac{A_{m2}}{A_{m1}}\right)}{\left(1 + \frac{E_{m2}}{E_{m1}}\left(\frac{A_{m2}}{A_{m1}}\right)\right)}$$

FIG. 7 is a graph of the above equation showing the resultant effective coefficient of thermal expansion $\alpha_e$ as a function of the ratio of effective cross-sectional areas $A_{m2}/A_{m1}$ of a pair of spring-like elements mounted in parallel. For example line $l_1$ is a graph of the above equation where the first material is steel and the second material is Si—Ni ceramic. The graph and accompanying chart demonstrates that for line $l_1$ the effective coefficient of thermal expansion can be made to match the coefficient of thermal expansion of a typical piezoelectric element (7.5 $e^{-6} \cdot 1/C°$) when the ratio of cross-sections of Si—Ni to steel is 0.61.

The inner and outer housing portions may be formed of any type of material as long as one material has a coefficient of thermal expansion greater than that of the piezoelectric material and the other material has a coefficient of thermal expansion less than that of the piezoelectric material. Of course a number of design considerations would go into selecting one material versus another. For example, the outer housing portion needs to be rugged and capable of protecting the piezoelectric material from environmental hazards including mechanical contact, heat and chemical attack of the type that characterize the environment in which internal combustion engines are used. For this reason, steel is a preferred type of material. Ceramic material makes a good choice for the inner housing portion because it has a coefficient of thermal expansion below that of piezoelectric material and because its extreme rigidity can provide a higher degree of strength and stiffness to the resulting composite actuator housing.

INDUSTRIAL APPLICABILITY

The subject invention will find utility in a variety of actuator applications where the fast, predictable response of piezoelectric material is desirable and where the ability to produce consistent operating characteristics over a broad range of operating temperatures is important. For example, the subject invention will be particularly useful in forming the actuator for a fuel injector nozzle assembly for use on over-the-road diesel engines used in light and mid-range trucks.

What is claimed is:

1. A piezoelectric actuator assembly which is insensitive to changes in temperature over a predetermined range of operating temperatures, comprising a. a piezoelectric element adapted to change its length upon application of an electrical potential, said piezoelectric element having a coefficient of thermal expansion $\alpha_p$;

b. an actuator housing at least partially surrounding said piezoelectric element, one end of said piezoelectric element being supported in fixed position relative to said actuator housing;

c. a movable element mounted with respect to said housing for displacement by said piezoelectric element whenever said piezoelectric element changes its length;

wherein said actuator housing includes a first housing portion having a longitudinal axis and extending along the extendable length of said piezoelectric material toward said moveable element, said first housing portion being formed of a first material having a coefficient of thermal expansion $\alpha_{m1} > \alpha_p$ and a second portion having a longitudinal axis which is parallel to the longitudinal axis of said first housing portion, said second housing portion being formed of a second material having a coefficient of thermal expansion $\alpha_{m2} < \alpha_p$, said first and second housing portions being shaped and affixed to one another in a manner to have an effective coefficient of thermal expansion $\alpha_e$ equal to the coefficient of thermal expansion of said piezoelectric element over the predetermined range of operating temperatures to cause the displacement of said moveable element and the response time to be the same at any given temperature within the predetermined temperature range upon application of the same electrical potential to said piezoelectric element.

2. A piezoelectric actuator assembly as defined in claim 1, wherein said first material has a modulus $E_{m1}$ and said first housing portion has an effective cross-sectional area $A_{m1}$, said second material has a modulus $E_{m2}$ and said second housing portion has an effective cross-sectional area $A_{m2}$ and wherein the ratio of $A_{m2}/A_{m1}$ is selected such that $$\alpha_p = \frac{\alpha_{m1} + \alpha_{m2}\frac{E_{m2}}{E_{m1}}\left(\frac{A_{m2}}{A_{m1}}\right)}{\left(1 + \frac{E_{m2}}{E_{m1}}\left(\frac{A_{m2}}{A_{m1}}\right)\right)}.$$

3. A piezoelectric actuator assembly as defined in claim 1, wherein said first housing portion is cylindrical and said second housing portion is cylindrical and located concentrically within said first portion.

4. A piezoelectric actuator assembly as defined in claim 3, wherein said piezoelectric element is a laminated stack of piezoelectric devices, said cylindrical first housing portion includes a shoulder extending radially inwardly at one end and wherein said housing includes a disc located within said first housing portion engaging said shoulder on one side and engaging said piezoelectric element on the other side to define the fixed position for the supported end of said piezoelectric element, said disc being positioned within said cylindrical first housing portion to engage one end of said cylindrical second housing portion and further including a spacer located within said cylindrical first housing portion in stacked co-axial relationship with the other end of said cylindrical second housing portion, wherein said housing is adapted to be mounted in a manner to place said cylindrical first housing portion in tension while placing said cylindrical second housing portion and said spacer in compression.

5. A piezoelectric actuator assembly as defined in claim 4, further including a disc spring positioned in axial stacked relationship between said other end of said second housing portion and said spacer, said disc spring placing a biasing force on the end of said piezoelectric element opposite said disc to bias tending to hold said piezoelectric element into engagement with said disc.

6. A piezoelectric actuator assembly as defined in claim 1, wherein said first material is steel and said second material is ceramic material.

7. A piezoelectric actuator assembly as defined in claim 6, wherein said ceramic material is Si—Ni ceramic.

8. A piezoelectric actuator assembly as defined in claim 1, wherein said first material is steel and said second material is a piezoelectric material to which an actuating voltage may be applied at the same time as said piezoelectric element.

9. A valve assembly having a constant operating stroke and response time throughout a predetermined range of operating temperatures, comprising
   a. a valve body including an inlet, an outlet, a valve seat located within a fluid pathway between said inlet and said outlet;
   b. a valve element mounted to move between
      i. a closed position engaging said valve seat to shut off the fluid within said pathway, and
      ii. an open position spaced from said valve seat to permit fluid communication between said inlet and said outlet;
   c. a piezoelectric valve actuator for moving said valve element between said opened and closed positions upon application of electrical potential, said piezoelectric valve actuator including
      i. a piezoelectric element adapted to change its length upon application of an electrical potential, said piezoelectric element having a coefficient of thermal expansion $\alpha_p$, and
      ii. an actuator housing at least partially surrounding said piezoelectric element, one end of said piezoelectric element being supported in fixed position relative to said actuator housing;

wherein said actuator housing includes a first housing portion having a longitudinal axis, said first housing portion being formed of a first material having a coefficient of thermal expansion $\alpha_{m1} > \alpha_p$ and a second housing portion having a longitudinal axis which is parallel to the longitudinal axis of said first housing portion, said second housing portion being formed of a second material having a coefficient of thermal expansion $\alpha_{m2} < \alpha_p$, said first and second housing portions being shaped and affixed to one another in a manner to have an effective coefficient of thermal expansion $\alpha_e$ equal to the coefficient of thermal expansion of said piezoelectric element over the predetermined range of operating temperatures to cause the displacement and the response time of said moveable element to be the same at any given temperature within the predetermined temperature range upon application of the same electrical potential to said piezoelectric element.

10. A valve assembly as defined in claim 9, wherein said first material has a modulus $E_{m1}$ and said first housing portion has an effective cross-sectional area $A_{m1}$, said second material has a modulus $E_{m2}$ and said second housing portion has an effective cross-sectional area $A_{m2}$ and wherein the ratio of $A_{m2}/A_{m1}$ is selected such that $$\alpha_p = \frac{\alpha_{m1} + \alpha_{m2}\frac{E_{m2}}{E_{m1}}\left(\frac{A_{m2}}{A_{m1}}\right)}{\left(1 + \frac{E_{m2}}{E_{m1}}\left(\frac{A_{m2}}{A_{m1}}\right)\right)}.$$

11. A valve assembly defined in claim 9, wherein said first housing portion is cylindrical and said second housing portion is cylindrical and located concentrically within said first housing portion.

12. A valve assembly as defined in claim 11, wherein said piezoelectric element is a laminated stack of piezoelectric devices, said cylindrical first housing portion includes a shoulder extending radially inwardly at one end and wherein said housing includes a disc located within said first housing portion engaging said shoulder on one side and engaging said piezoelectric element on the other side to define the fixed position for the engaged end of said piezoelectric element, said disc being positioned within said cylindrical first housing portion to engage one end of said cylindrical second housing portion and further including a spacer located within said cylindrical first housing portion in stacked co-axial relationship with the other end of said cylindrical second housing portion, wherein said housing is adapted to be mounted in a manner to place said cylindrical first housing portion in tension while placing said cylindrical second housing portion and said spacer in compression.

13. A valve assembly as defined in claim 12, further including a disc spring positioned in axial stacked relationship between said other end of said second housing portion and said spacer, said disc spring placing a biasing force on the end of said piezoelectric element opposite said disc tending to hold said piezoelectric element into engagement with said disc.

14. A valve assembly as defined in claim 12, wherein said valve body includes a recess for receiving one end of said valve actuator, said recess containing internal threads, said cylindrical first valve portion includes external threads adapted to mate with said internal threads such that upon assembly, said valve actuator is received within said recess, the amount of tension created within said first housing portion and the amount of compression created within said second housing portion being dependent upon the amount of rotational torque imposed on said valve actuator housing.

15. A valve assembly as defined in claim 9, wherein said first material is steel and said second material is ceramic material.

16. A valve assembly as defined in claim 15, wherein said ceramic material is Si—Ni ceramic.

17. A valve assembly as defined in claim 9, wherein said first material is steel and said second material is a piezoelectric material to which an actuating voltage may be applied at the same time as said piezoelectric element.

* * * * *